ELECTRONIC AMPLIFIER

Filed April 16, 1959

INVENTOR
ALBERT W. VINAL
BY Ralph R Barnard
ATTORNEY 3,048,790

ELECTRONIC AMPLIFIER

Albert W. Vinal, Owego, N.Y., assignor to International Business Machines Corporation, New York, N.Y., a corporation of New York Filed Apr. 16, 1959, Ser. No. 806,871
5 Claims. (Cl. 330—29)

Figure 2:
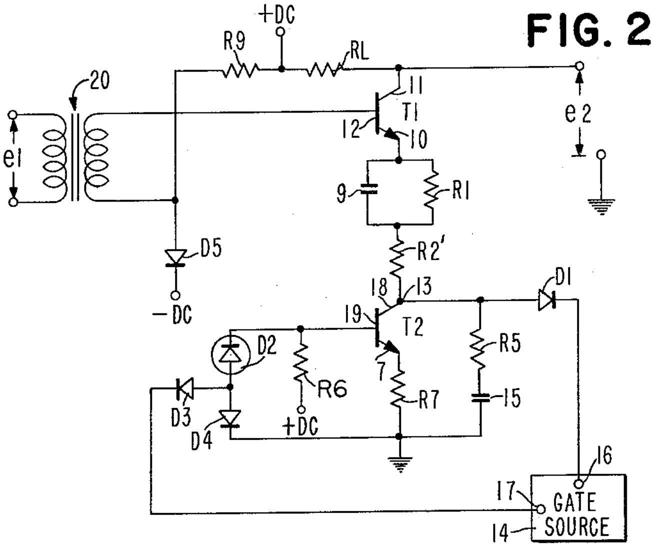

This invention relates to transistorized electronic amplifiers and more particularly to a new and improved transistorized electronic amplifier having two selectable levels of A.C. voltage gain.

In electronic sampling data, video display and electrical pulse systems, it is often desired to utilize an electronic amplifier having two selectable levels of A.C. voltage gain. In many engineering applications, it may be desired that the low level of A.C. voltage gain be of such a small order of magnitude that the amplifier is virtually in the nontransmitting condition, whereas the high level of gain be of a very large amplitude. Prior art electronic gating amplifiers are available to provide for such an operation. These devices often comprise a first transistor connected in a common emitter configuration and a control transistor connected to the base emitter circuit of the first transistor, so that the operating point of the first transistor can be determined by the conduction level of the control transistor.

Still other electronic switches utilize a first transistor connected in a common base configuration between an input and output terminal with a control transistor connected within the base emitter circuit of the first transistor. As in the first example of the prior art techniques, the operating point of the first transistor and the level of A.C. voltage amplification between its input and output terminal is altered in accordance with whether or not the control transistor is in a conducting or nonconducting condition.

While these prior art techniques have been useful as electronic switches, the range over which the two levels of A.C. voltage gain can be selected has been considerably less than optimum. Moreover, the action of a control transistor on another transistor which is in the signal channel has been such to introduce a gating voltage in the D.C. voltage level at the output terminal so that small A.C. signals passing therethrough may be lost or distorted.

In view of the shortcomings of the prior art, the present invention teaches a technique whereby a transistor in a common emitter configuration is connected between an input and output terminal, while a variable A.C. impedance having two selectable magnitudes is connected between the emitter and ground. This selectively controlled emitter impedance selects two levels of A.C. voltage gain between the input and output terminal of the transistor in the common emitter configuration by having two A.C. impedance levels in the emitter circuit of the transistor and at the same time maintaining the direct current through the emitter at a constant level so that the operating point of the transistor is not altered. Because the operating point of the transistor is not altered in switching from one level of gain to the other, the objectionable gating voltage is not introduced into the D.C. voltage level as in the prior art devices. In addition, the two levels of A.C. voltage gain can be designed accurately over a wide range by appropriately selecting the circuit parameters of the variable A.C. impedance.

It is, therefore, a primary object of the present invention to provide a new and improved transistorized electronic amplifier having two electronically selectable levels of A.C. voltage gain.

It is another object of the present invention to provide a new and improved transistorized electronic amplifier having two selectable levels of A.C. voltage gain wherein a D.C. voltage level change is not introduced at the output terminal as a result of switching from one level of gain to the other.

It is still another object of the present invention to provide a new and improved transistorized electronic amplifier having two selectable levels of A.C. voltage gain where each level can be designed accurately over a wide range by appropriately selecting the circuit parameters of a variable A.C. impedance.

Other objects of the invention will be pointed out in the following description and claims and illustrated in the accompanying drawings which disclose, by way of examples, the principle of the invention and the best mode which has been contemplated of applying that principle.

Figure 1:
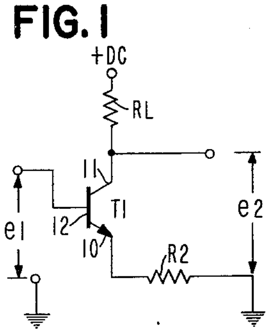
Figure 3:
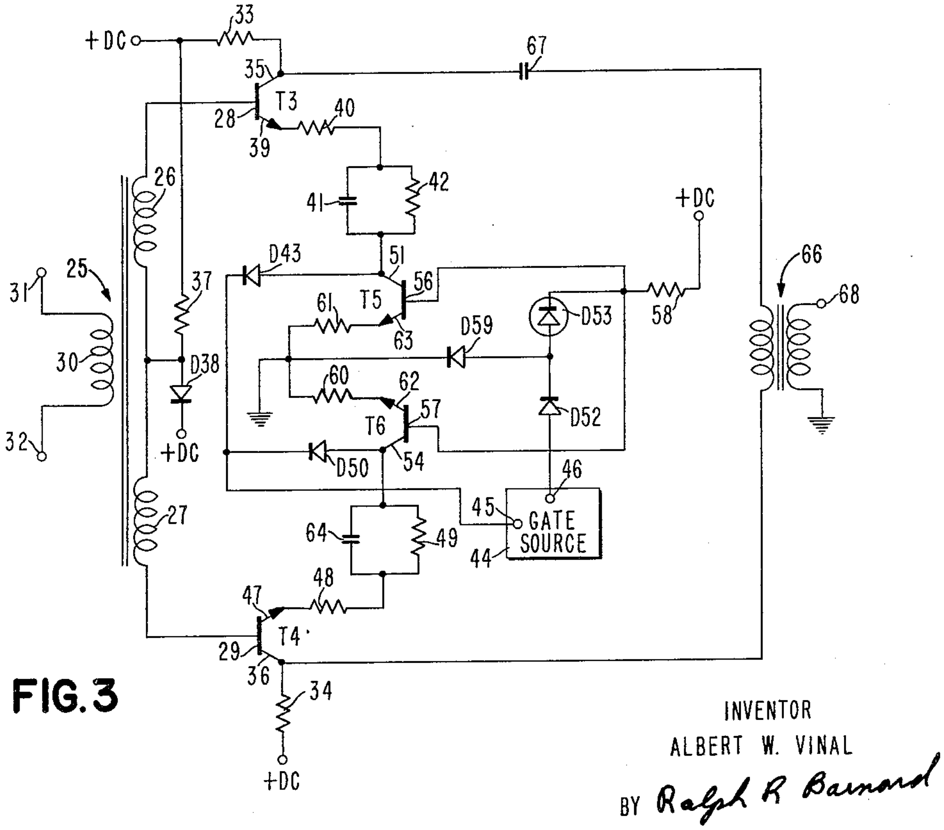

In the drawings:

FIG. 1 shows a transistor connected in a common emitter configuration including an emitter impedance according to the prior art;

FIG. 2 shows a transistor connected in a common emitter configuration wherein the emitter resistor of FIG. 1 is replaced by a selectively variable A.C. impedance means so as to provide an A.C. voltage amplifier having two selectable levels of A.C. voltage gain according to the teachings of the present invention; and FIG. 3 shows a differential amplifier having two selectable levels of A.C. voltage gain according to the teachings of the present invention.

Identical components shown in FIGS. 1 and 2 are referred to by the same reference numerals.

Referring to FIG. 2, an amplifier is shown according to the present invention utilizing a transistor T1 in a common emitter configuration with a selectively varibale impedance connected between its emitter and ground. As will be set forth in more detail hereinafter, the voltage gain between the input voltage *e1* and the output voltage *e2* is approximately equal to the product of the common base current gain of the transistor T1 times the ratio of the load resistance RL over the variable impedance having two selectable magnitudes. It is the crux of the present invention that two magnitudes of the impedance between the emitter and ground be selectable to provide two levels of A.C. voltage gain between the input and output terminals without modifying the direct current flow from the emitter to ground. As those skilled in the art will recognize, a change in the direct current flow from emitter to ground will alter the operating point of the transistor T1 and introduce a gating voltage in the D.C. voltage level of the output terminal of the transistor.

Referring to FIG. 1, transistor T1 comprises an emitter 10, a collector 11 and a base 12. As shown, collector 11 is connected to a +D.C. supply voltage through load resistance RL, while the emitter 10 is connected to ground through an impedance R2 so that the transistor operates in a conventional common emitter configuration. Moreover, if an A.C. input voltage *e1* is applied to the base thereof, an A.C. voltage *e2* is developed at the output terminal connected to the collector commensurate with:

$$\frac{e2}{e1} \cong \frac{rd}{rd+RL}\left(\frac{\beta RL}{rb+\left[1+\beta\frac{rd}{rd+RL}\right](re+R2)}\right) \quad (1)$$

where:

*rd*=common emitter collector resistance of transistor T1
*rb*=base spreading resistance of transistor T1
*β*=common emitter current gain of transistor T1
*re*=emitter resistance of transistor T1

Equation 1 represents a well known relationship and is also set forth on page 86 of a textbook entitled Transistor Electronics by Lo, Endres, Zawels, Waldhauer, Cheng, published by Prentice-Hall Inc., Englewood Cliffs, New Jersey, 1955.

Moreover, if within the transistor and circuit of FIG. 1, $\beta(R2)>>rb$ and $rd>>RL$, Equation 1 reduces to the following approximation:

$$\frac{e2}{e1}\cong\frac{\beta}{\beta+1}\frac{RL}{R2}\cong\alpha\frac{RL}{R2} \qquad (2)$$

where:

$\alpha$ is equal to the common base current gain of transistor T1

Accordingly, under the conditions set forth above, the A.C. voltage gain of the amplifier shown in FIG. 1 is proportional to the ratio of the magnitudes $$\frac{RL}{R2}$$

When it is desired to provide that the amplifier have two selectable levels of A.C. voltage gain, the effective magnitude of R2 may be altered to determine each condition of gain.

Referring now to FIG. 2, transistor T1 is shown connected in a common emitter configuration so as to provide two effective magnitudes of A.C. impedance in the emitter circuit in response to the presence and absence of gating voltage pulses from a conventional source 14. Therein, alternate paths are provided for the emitter current to pass through common terminal 13 to ground. One path comprises common terminal 13 and a series connection of resistance R5 and capacitor 15. Another path comprises common terminal 13 and diode D1 connected to a voltage gating source 14 through terminal 16. Still another path includes collector 18, emitter 7 and biasing resistor R7 of control transistor T2. Diode D1 is normally maintained in a forwardly biased condition by gate source 14. Meanwhile during this normal mode, control transistor T2 is maintained in a nonconducting condition as a result of a +D.C. source being applied to back-bias its base emitter junction through resistance R6 and emitter resistance R7. Under these conditions, zener diode D2 is maintained in its reverse breakdown voltage by the above-mentioned +D.C. source.

Accordingly, during this normal mode of operation (and disregarding the low impedance of capacitor 9), the effective A.C. impedance between the emitter of transistor T1 and ground comprises resistor R2′ connected in series with a parallel circuit comprising R5 and capacitor 15 in one leg and the forward resistance $rf$ of forwardly biased diode D1 and the source of impedance $Rs$ of gate source 14 appearing at terminal 16 in the other leg. Under these conditions (and disregarding the low impedance of capacitor 15), the A.C. voltage gain between the input terminal and output terminal of transistor T1 for FIG. 2 may be approximately represented by the following equation rather than Equation 2 which applied to FIG. 1:

$$\frac{e2}{e1}\cong\frac{\alpha RL}{R2'+\frac{(rf+Rs)R5}{R5+Rs+rf}} \qquad (3)$$

where:

$rf$=forward resistance of diode D1

$Rs$=source impedance to sampling gate source 14 appearing at terminal 16

When $R5$ is >> than $Rs+rf$, Equation 3 may be further simplified to:

$$\frac{e2}{e1}\cong\frac{\alpha RL}{R2'+rf+Rs} \qquad (4)$$

Considering Equation 4 as representing the high gain condition for the amplifier, this amplifier may be switched to a lower gain condition by driving control transistor T2 to a conducting condition and back biasing diode D1 so as to modify the effective A.C. emitter resistance of transistor T1. This may be accomplished by applying relatively positive voltage levels from sample gate source 14 to terminals 16 and 17. When a relatively positive voltage level is applied to terminal 17 by voltage gating source 14, diode D3 becomes back-biased and zener diode D2 remains in breakdown with a voltage drop $V_z$ so that the voltage level of base 19 rises above ground by a magnitude equal to the sum of $V_z$ and the voltage drop across D4. Hence, the base emitter junction of transistor T2 becomes forwardly biased.

Accordingly, the impedance from common terminal 13 through conducting transistor T2 to ground becomes relatively low compared to the reverse impedance of diode D1, and the effective A.C. emitter impedance of transistor T1 is approximately represented by a series parallel network comprising resistance R2′ in series with the common base collector resistance $rc$ of transistor T2 in one leg and resistor R5 and capacitor 15 in the other leg. Since the impedance of resistor R7 is small compared to the magnitude of $rc$, it may be disregarded. Accordingly, the A.C. voltage gain between the input and output terminals of transistor T1 is approximately equal to the following equation:

$$\frac{e2}{e1}\cong\frac{\alpha RL}{\frac{R5}{1+\frac{R5}{rc}}+R2'} \qquad (5)$$

Moreover, when $rc$ has a magnitude which is much greater than the magnitude of R5, Equation 5 may be approximately represented by the following equation:

$$\frac{e2}{e1}\cong\frac{\alpha RL}{R5+R2'} \qquad (6)$$

If Equation 4 is divided by Equation 6, the following expression may be obtained showing the ratio of the high gain condition (diode D1 conducting) to the low gain condition (transistor T2 conducting):

$$\frac{\text{High gain}}{\text{Low gain}}\cong\frac{R5+R2'}{R2'+Rs+rf} \qquad (7)$$

As a practical matter, by appropriately selecting these parameters in a circuit in accordance with FIG. 2, any ratio ranging from 1 to 1,000 may be obtained between the low and high gain conditions.

Switching the emitter current of transistor T1 from passing through diode D1 to transistor T2 in the manner suggested hereinabove so as to change the level of A.C. voltage gain of transistor T1 is accomplished by the application of a positive gating voltage pulse to terminals 16 and 17, so as to back-bias diode D1 and drive transistor T2 to a conduction. Prior to the gating voltage pulse, terminal 16 is at a voltage level lower than that of common terminal 13 and diode D1 is forwardly biased. Moreover, during this condition, terminal 17 is at a voltage level below ground by an amount equal to the zener breakdown voltage $Vz$ plus the voltage drop across D3 in a forwardly biased condition, so that the base 19 of transistor T2 is slightly below ground voltage level. Since the base 19 is below the ground voltage level, the base emitter junction is back-biased and transistor T2 is in a nonconducting condition. As indicated above, during this condition, the A.C. voltage gain of transistor T1 may be approximately represented by Equation 4.

On the occurrence of a gating voltage pulse, the voltage level at terminal 16 is raised such that diode D1 is back-biased. Moreover, the voltage level of terminal 17 is raised so as to back-bias diode D3, forward bias diode D4 and raise the voltage of base 19 above ground, so as to drive transistor T2 into conduction. Meanwhile, zener diode D2 is maintained in its breakdown condition by the +D.C. supply voltage being applied thereto via resistor R6. Diode D4 thus provides a ground return for the base emitter circuit of transistor T2. As long as these conditions continue, the current in the collector of transistor T2 is equal to $$\alpha 2 \frac{Vz}{R7}$$

where $\alpha 2$ is the common base current gain of transistor T2. It should be noted that transistor T2 is connected in a common base configuration.

As will be recalled, it is an important feature of the present invention that the D.C. operating point of transistor T1 remain the same in both the high gain and low gain condition even though the A.C. emitter impedance is modified. In order to provide this constant operating point, it is essential that the D.C. average current flowing through emitter 10 of T1 remain the same whether D1 is conducting or T2 is conducting. When D1 is conducting, the emitter current is approximately equal to the voltage difference V*d* between the base 12 of T1 and common terminal 13 divided by resistors R1 and R2′. On the occurrence of the gating voltage pulse at the output terminals 16 and 17 of source 14, the D.C. current can no longer pass through reversibly biased D1, but it passes through the collector 18 of transistor T2. Since, as indicated above, the current through collector 18 during the conduction of T2 is equal to $$\alpha 2 \frac{Vz}{R7}$$

the operating point of transistor T1 may be maintained constant in accordance with the teachings of the present invention if the following equation is satisfied during the design of the circuitry as shown in FIG. 2.

$$\frac{Vd}{R1+R2'} = \alpha 2 \frac{Vz}{R7} \qquad (8)$$

In conclusion, it is fundamental to the teachings of the present invention that during the mode of operation when a gating voltage pulse appears at the output terminals 16 and 17 of source 14 that the D.C. current level passing through R1 and R2′ and the control transistor is the same as the D.C. current level passing through R1 and R2′ to ground through forward biased diode D1 during the other mode of operation when the gating voltage pulse is no longer present and the control transistor is in its nonconducting condition. In addition to providing a ground return for the base emitter junction of T2 while it is in its conducting state, diode D4 also provides a temperature compensation function. For example, if the voltage drop across the base emitter junction of transistor T2 is decreased as a result of a temperature rise, the voltage drop across diode D4 will also be decreased by the temperature rise by an equal amount. Since these two voltage drops are of opposite polarity, the voltage level of the base and the operating point of T2 are not modified.

Diode D5 performs a similar function for transistor T1. FIG. 2 shows the A.C. voltage *e*1 being applied to base 12 of transistor T1 via a transformer 20. This technique, is desirable in that the input resistance of transistor T1 must be maintained low compared to *rb* in order that Equation 1 may approximately represent the A.C. voltage gain of that transistor. Other techniques may be employed to maintain the input impedance of T1 low such as utilizing a stabilized D.C. amplifier in place of transformer 20.

The teachings of the present invention as described hereinabove in connection with FIG. 2 have wide application, and by way of example, may be utilized by a differential amplifier application. A differential amplifier embodying the present invention is shown in FIG. 3. Therein, a transformer 25 is provided having an input winding 30 and two output windings 26 and 27. One terminal of windings 26 and 27 is commoned. The other terminal of winding 26 is connected so that the voltage thereon may be applied to the base 28 of an NPN transistor T3, which is connected for operation in a common emitter configuration. The other terminal of output winding 27 is connected so that the voltage thereon may be applied to the base 29 of an NPN transistor T4, which is also connected for operation in a common emitter configuration.

Transistors T3 and T4 are established at their operating point by passing a direct current through their base collector and base emitter junctions. For example, the collector 35 of NPN transistor T3 is connected to a +D.C. supply voltage via resistor 33, and the collector 36 of NPN transistor T4 is connected to the +D.C. supply voltage via resistor 34. Moreover, a voltage is applied to the base of both transistors T3 and T4 by a voltage divider comprising a series connection of a resistor 37 and a diode D38 connected between two +D.C. supply voltages, as shown. The magnitudes of these +D.C. supply voltages should be selected so as to differ in magnitude in a manner such that diode D38 is forwardly biased. The common terminal of resistor 37 and diode D38 is connected to the common terminal of secondary windings 26 and 27, as shown. In accordance with the present invention, the bias for the emitter 39 of transistor T3 is provided by the direct current passing through a series connection of resistor 40, resistor 42 and either diode D43 connected to a gate voltage source 44 or a control transistor T5, depending on the voltage level being provided at terminals 45 and 46. Similarly, the path for the direct current passing through the emitter 47 of transistor T4 includes a series connection of resistor 48, resistor 49 and either diode D50 (connected to a gate voltage source 44) or a control transistor T6, depending on whether a gating voltage pulse is being provided at terminals 45 and 46 by source 44.

In accordance with the teachings of the present invention, the A.C. voltage gain of both transistors T3 and T4 may be changed by altering the effective A.C. impedance between the emitter of each and ground.

Referring to transistor T3, this modification of the effective A.C. impedance between the emitter and ground is accomplished by altering the A.C. conduction path from common junction 51 and ground. During the high gain condition, diode D43 is maintained forwardly biased by the voltage level being applied thereto from gating source 44 via terminal 45. At the same time, transistor T5 is maintained in a nonconducting condition by the voltage level being applied by a voltage gate source 44 via terminal 46, diode D52 and zener diode D53. As a result, the A.C. impedance in the current of emitter 39 corresponds to a high gain condition similar to that represented by Equation 4.

Referring to transistor T4, this modification of the effective A.C. impedance between the emitter 47 and ground is accomplished by altering the A.C. conduction path from common junction 54 and ground. During the high gain condition, diode D50 is maintained forwardly biased by the voltage level being applied thereto from gating source 44 via terminal 45. At the same time, transistor T6 is maintained in a non-conducting condition by the voltage level being applied by the voltage gate source 44 via terminal 46, diode D52 and zener diode D53. Consequently, the A.C. impedance in the circuit of emitter 47 corresponds to a high gain condition similar to that represented by Equation 4.

On the other hand, during the low gain condition of operation, the A.C. current conduction path in the emitter 39 of T3 includes common junction 51 and transistor T5, which is driven to a conductive state by the gating voltage pulse applied by source 44 to terminal 46. Meanwhile, the same source applies a voltage gating pulse via terminal 45 to back-bias diode D43. As a result, the A.C. impedance in the circuit of emitter 39 of transistor T3 is altered to correspond to the low gain condition similar to that represented by Equation 6.

Similarly, during the low gain condition of operation, the A.C. current conduction path in the emitter 47 of T4 passes through the common junction 54 and transistor T6 inasmuch as that transistor is driven to a conductive state by the gating voltage pulse applied by source 44 to terminal 46. Meanwhile, the same source applies a voltage gating pulse via terminal 45 to back-bias diode D43. Hence, the A.C. impedance in the circuit of emitter 47 of transistor T4 is altered to correspond to the high condition similar to that represened by Equation 6.

During the high A.C. voltage gain condition for the differential amplifier of FIG. 3, diode D52 is in a forwardly biased condition inasmuch as terminal 46 is maintained at a voltage level which is sufficiently below ground such that base 56 of transistor T5 and base 57 of transistor T6 are in turn maintained at a voltage level slightly below ground. Zener diode D53 is maintained in breakdown by a + D.C. source being applied through resistor 58 so that its voltage drop is constant. Similar to the circuit of FIG. 2, diode D59 is reversibly biased during the high gain condition of operation and forwardly biased during the low gain condition of operation so as to perform both a temperature compensation and a ground return function similar to the provided by diode D4 in FIG. 2. Resistors 60 and 61 are utilized to ground the emitters 62 and 63 of transistors T6 and T7, respectively, and function in the same manner as R7 of FIG. 2. It should be noted that the selection of the magnitudes of resistors 60 and 61 has to be determined so that an equation corresponding to Equation 8 (modified to suit the parameters of FIG. 3) may be satisfied.

The circuit of FIG. 3 may be utilized to select and amplify the differences between the instantaneous voltages being applied to its two input terminals 31 and 32. For example, consider that the voltage being applied to terminal 31 has a very large noise voltage adjacent in time with a relatively small signal voltage. Similarly, consider that the voltage being applied to terminal 32 contained a large noise voltage occurring at approximately the same time as in the first input and it is desired to take the instantaneous difference between these two input voltages. Normally, without the two levels of A.C. voltage gain provided according to the teachings of the present invention, the large noise voltage within each input will tend to drive each of transistors T3 and T4 into saturation. However, if the voltage output level from gating voltage source 44 is of sufficient width and properly timed, both of these transistors T3 and T4 can be maintained in their very low level gain condition, and this undesired saturation will not occur. Thereafter, on the occurrence of the signal voltage at one or both of the input terminals, source 44 then may be utilized to raise the level of A.C. voltage gain in T3 and T4 as set forth hereinabove.

Consequently, T3 will amplify the signal voltage being applied to its base via terminal 31 with a high level of gain and T4 will amplify the signal voltage being applied to its base via terminal 32 with the same high level of gain. As shown, the collectors of each of transistors T3 and T4 are connected to the opposite terminals of an output transformer 66 so that a voltage commensurate with their instantaneous difference is induced in its output. It is important to note that according to the teachings of the present invention the modification of the A.C. voltage gain of transistors T3 and T4 connected as shown from one level to another does not alter the operating point of each so that a gating voltage pulse is induced on the collector of each, which might grossly distort the signal voltages of which the instantaneous difference is being determined. Since the common mode noise voltage rejection provided by transformer 25 is not sufficient, it is also important the transistors T3 and T4 have a common mode noise rejection type operation. Accordingly, those skilled in the art will note that the identical emitter impedance of both of these transistors provides the necessary additional differencing function. As a practical matter, this differencing action will be operating best when each of the transistors T3 and T4 are in the high-gain state.

As indicated hereinabove, the two levels of A.C. voltage gain which can be provided according to the teachings of the present invention may be selected by appropriately selecting the magnitudes of the impedance parameters. Moreover, the low level of A.C. voltage gain may be sufficiently small so that the amplifier may be considered as being in an off or nontransmitting condition. Considered in this light, the teachings of the present invention may be considered as applicable to electronic switches. As is well known, electronic switches have a wide variety of practical engineering applications. Transistors T1–T6 have been shown as NPN transistors. However, it should be clear that PNP transistors could have been used if the circuit voltage sources, diodes, etc. were properly selected and arranged.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. A sampling amplifier having two levels of A.C. voltage gain comprising a transistor having a collector base and emitter circuit connected in a common emitter configuration including a variable A.C. impedance means in its emitter circuit, said transistor having an input and output terminal, said A.C. voltage gain between said input and output terminal being dependent upon the magnitude of said variable A.C. impedance, said variable A.C. impedance means including first and second direct current paths, an electronic gating means having a first and second terminal, said first path comprising a diode connected to said first terminal of said electronic gating means, said second path comprising the collector emitter circuit of a control transistor connected to said terminal of said electronic gating means, said electronic gating means acting to forward bias said diode while maintaining said control transistor in a nonconducting condition during one mode of operation of said amplifier and selectively driving said control transistor to conduction while maintaining said diode reversibly biased during the other mode of operation of said amplifier, and means for maintaining the direct current through said control transistor during said other mode equal to the direct current through said diode during one mode so that the D.C. operating point of said transistor connected between said input and output terminals remains the same during each mode.

2. A differential amplifier having two levels of A.C. voltage gain having a first transistor having a collector base and emitter circuit connected in a common emitter configuration including a first variable A.C. impedance means in its emitter circuit, said first transistor having an input and output terminal, said A.C. voltage gain between said input and output terminal of said first transistor being dependent upon the magnitude of said variable A.C. impedance, a second transistor connected in a common emitter configuration including a second variable A.C. impedance in its emitter circuit, said second transistor having an input and output terminal, said A.C. voltage gain between said input and output terminal of said second transistor being dependent upon the magnitude of said second variable A.C. impedance, said input terminals of said first and second transistors being connected so that each receives an input voltage commensurate with the instantaneous difference between two other voltages being sampled, an output transformer having a primary and secondary winding, said output terminals of said first and second transistors being connected to the opposite extremities of the primary of said output transformer so as to induce a voltage in the secondary winding of said output transformer equal to the difference in magnitude of the voltages derived at the output terminal of said first and second transistors, said first and second variable A.C. impedance means cooperatively coacting to provide within each transistor two identical A.C. voltage gain levels while a the same time providing a constant D.C. emitter current within said first and second transistors so as to maintain their D.C. operating point.

3. An amplifier having two levels of A.C. voltage gain comprising a transistor having a base, collector and emitter circuit connected in a common emitter configuration, said transistor having an input and output terminal, said transistor having a variable A.C. impedance means connected in its emitter circuit having plural selectable A.C. impedance levels therein, an electronic gating means for selecting said A.C. impedance levels, said selectable A.C. impedance connected between said emitter and ground comprising a fixed A.C. impedance in series with a parallel circuit comprising a diode in one path and the collector emitter circuit of a control transistor connected in a common emitter configuration in the other path, said electronic gating means acting during one mode of operation to maintain said control transistor in a nonconducting condition and said diode in its forward biased condition, said electronic gating means acting in the other mode to maintain said control transistor to its conducting condition and back bias, said control transistor circuit being designed so that the D.C. current level in said variable impedance remains the same during both modes of operation.

4. A sampling amplifier having two levels of A.C. voltage gain comprising a transistor having a base, collector and emitter circuit connected in a common emitter configuration including a variable A.C. impedance means in its emitter circuit; said transistor having an input and output terminal; the A.C. voltage gain between said input and output terminals being dependent upon the magnitude of said variable A.C. impedance; said variable A.C. impedance means includes first and second parallel direct current paths; an electronic gating means having a first and second terminal; said first path comprising a diode connected to said first terminal of said electronic gating means; said second path comprising a control transistor having a base, collector and emitter circuit wherein said collector emitter circuit of said control transistor is being connected to said second terminal of said electronic gating means; said electronic gating means acting to forward bias said diode while maintaining said control transistor in a nonconducting condition during one mode of operation of said amplifier and selectively driving said control transistor to conduction while maintaining said diode reverse biased during the other mode of operation of said amplifier.

5. A sampling amplifier having two levels of A.C. voltage gain as set forth in claim 4 wherein said control transistor has a zener diode connected within its base emitter circuit in a manner so that it remains in a reverse breakdown condition regardless of whether said control transistor is in a conducting or nonconducting condition, the breakdown voltage of said zener diode acting to determine the collector emitter current of said control transistor during its conducting condition, said breakdown voltage being selected so that the direct current in said second path comprising the collector emitter circuit of said control transistor during one mode of operation is equal to the direct current passing through said diode in said first path during the other mode of operation.

References Cited in the file of this patent

UNITED STATES PATENTS

| | | |
|---|---|---|
| 2,323,634 | Van Slooten | July 6, 1943 |
| 2,544,211 | Barton | Mar. 6, 1951 |
| 2,786,964 | De Witt | Mar. 26, 1957 |

FOREIGN PATENTS

| | | |
|---|---|---|
| 216,799 | Australia | Aug. 20, 1958 |

OTHER REFERENCES

Diers: "Transistorized Preamp and Control Unit," Popular Electronics, September 1958, pages 61–63.